(12) United States Patent
Boerstler et al.

(10) Patent No.: US 8,054,119 B2
(45) Date of Patent: Nov. 8, 2011

(54) SYSTEM AND METHOD FOR ON/OFF-CHIP CHARACTERIZATION OF PULSE-WIDTH LIMITER OUTPUTS

(75) Inventors: David William Boerstler, Round Rock, TX (US); Eskinder Hailu, Austin, TX (US); Jieming Qi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 1472 days.

(21) Appl. No.: 11/109,090

(22) Filed: Apr. 19, 2005

(65) Prior Publication Data

US 2006/0232310 A1    Oct. 19, 2006

(51) Int. Cl.
*H03K 3/017*    (2006.01)

(52) U.S. Cl. ....................................................... 327/172

(58) Field of Classification Search .................. None
See application file for complete search history.

(56) References Cited

U.S. PATENT DOCUMENTS

| | | | |
|---|---|---|---|
| 3,586,884 A * | 6/1971 | Gassmann | 327/176 |
| 3,594,733 A | 7/1971 | Lukens, II | |
| 3,594,773 A | 7/1971 | Cookie et al. | |
| 3,638,045 A | 1/1972 | Hughes | |
| 3,831,098 A | 8/1974 | Fletcher et al. | |
| 4,245,167 A | 1/1981 | Stein | |
| 4,305,010 A | 12/1981 | Wise | |
| 4,334,243 A | 6/1982 | Srivastava | |
| 4,881,040 A * | 11/1989 | Vaughn | 327/160 |
| 5,268,594 A | 12/1993 | Huang | |
| 5,309,034 A | 5/1994 | Ishibashi | |
| 5,309,456 A | 5/1994 | Horton | |
| 5,396,110 A | 3/1995 | Houston | |
| 5,566,129 A | 10/1996 | Nakashima et al. | |
| 5,672,990 A | 9/1997 | Chaw | |
| 5,761,151 A | 6/1998 | Hatakeyama | |
| 5,789,958 A * | 8/1998 | Chapman et al. | 327/261 |
| 5,875,152 A | 2/1999 | Liu et al. | |
| 5,929,684 A | 7/1999 | Daniel | |
| 5,969,555 A | 10/1999 | Suda | |
| 6,060,922 A | 5/2000 | Chow et al. | |
| 6,069,508 A * | 5/2000 | Takai | 327/161 |
| 6,084,482 A | 7/2000 | Nakamura | |
| 6,356,129 B1 | 3/2002 | O'Brien et al. | |

(Continued)

OTHER PUBLICATIONS

Katz, Randy H.., "Contemporary Logic Design", , Benjamin/Cummings Publishing Company, Inc. Redwood City CA (1994) pp. 138-139.*

(Continued)

*Primary Examiner* — Lincoln Donovan
*Assistant Examiner* — Khareem E Almo
(74) *Attorney, Agent, or Firm* — Stephen Walder, Jr.; Matthew Talpis

(57) ABSTRACT

The present invention provides for a method for characterization of pulse-width limiter outputs. A known clock signal is received. A pulse width of the received known clock signal is limited through a first pulse-width limiter to generate a first intermediate signal. The first intermediate signal is delayed by a known amount to generate a first delayed signal. The first intermediate signal is inverted to generate a first inverted signal. A pulse width of the first inverted signal is limited through a second pulse-width limiter to generate a second intermediate signal. The second intermediate signal is delayed by a known amount to generate a second delayed signal. A logic OR operation is performed on the first delayed signal and the second delayed signal to generate a clock out signal.

18 Claims, 3 Drawing Sheets

U.S. PATENT DOCUMENTS

| | | | |
|---|---|---|---|
| 6,486,722 B2 * | 11/2002 | Yamauchi | 327/270 |
| 6,661,271 B1 | 12/2003 | Burdick et al. | |
| 6,918,050 B2 * | 7/2005 | Yoshikawa et al. | 713/503 |
| 6,937,075 B2 | 8/2005 | Lim et al. | |
| 6,973,145 B1 | 12/2005 | Smith et al. | |
| 7,242,233 B2 | 7/2007 | Aipperspach et al. | |
| 7,358,785 B2 | 4/2008 | Boerstler et al. | |
| 2001/0011913 A1 | 8/2001 | Sher | |
| 2003/0102896 A1 | 6/2003 | Porter et al. | |
| 2005/0010885 A1 | 1/2005 | Aipperspach et al. | |
| 2005/0035801 A1 * | 2/2005 | Weiner | 327/172 |
| 2008/0136480 A1 | 6/2008 | Boerstler et al. | |

OTHER PUBLICATIONS

Rabaey, Jan M., "Digital integrated Circuits—A Design Perspective", Prentice Hall (1996), Chapter 4, p. 193, Example 4.1.

"A Simplified Method for Limiting Clock Pulse Width" IBM, File Date: Oct. 23, 2003, U.S. Appl. No. 10/692,412, Applicant: Anthony Gus Aippersoach et al.

* cited by examiner

SYSTEM AND METHOD FOR ON/OFF-CHIP CHARACTERIZATION OF PULSE-WIDTH LIMITER OUTPUTS

CROSS-REFERENCED APPLICATIONS

This application relates to co-pending U.S. patent application Ser. No. 10/692,416 entitled A SIMPLIFIED METHOD FOR LIMITING CLOCK PULSE WIDTH, filed on Oct. 23, 2003.

TECHNICAL FIELD

The present invention relates generally to the field of circuit design and testing and, more particularly, to a system and method for on/off-chip characterization of pulse-width limiter outputs.

BACKGROUND

In many modern computer program applications, especially those dealing with large arrays, the maximum pulse width of clock signals operating on these arrays needs to be limited. If the pulse width is too wide, for example, it can cause pre-charged array nodes to lose their logic value and result in array failure. Thus, it is common for a clock source to be pulse-width limited before being asserted onto array grids. One example of a novel technique is described in the invention entitled A SIMPLIFIED METHOD FOR LIMITING CLOCK PULSE WIDTH, Ser. No. 10/692,416, which proposes a circuit that limits the maximum pulse width of a clock source.

One important issue that needs to be addressed is the off-chip characterization of such pulse-width limiter circuits in a typical bandwidth-limited laboratory setup. For example, a pulse-width limiter with a maximum allowable pulse width of 100 picoseconds (ps) will have significant power at around $1/100$ ps (10 GHz). However, typical laboratory setups that can guarantee signal integrity at such frequencies are often cost-prohibitive. Therefore, a methodology is required that is capable of quantifying the maximum pulse width from a pulse-width limiter circuit in an ordinary bandwidth-limited laboratory environment.

One possible solution is on-chip characterization of the pulse-width limiter output. This can be accomplished, for example, by sampling the pulse-width limiter output with various phases of a voltage-controlled oscillator (VCO) input. However, this approach relies on the discrete phases available from the VCO and, therefore, this discreteness limits the resolution. Moreover, unless the VCO is locked, by, for example, a phase locked loop (PLL), the VCO input can be compromised by large jitter at each of its phases, thereby increasing the measurement uncertainty.

An alternative approach to bypassing the measurement bandwidth constraint employs pulse stretcher circuitry. Pulse stretchers, for example, can extend or stretch the output of the pulse-width limiter, thereby reducing the bandwidth requirement of the laboratory measurement setup. This approach, however, is also subject to limitations. In particular, the precise magnitude of the pulse extension caused by the pulse stretchers has to be known, which thereby requires characterization of the pulse stretchers' performance itself. Thus, while one can employ the pulse stretchers to bring the test output within the bandwidth requirement of the measurement setup, the desired measurement remains unknown without an often-complicated additional characterization of the pulse stretchers.

Therefore, there is a need for a system and/or method for on/off-chip characterization of pulse-width limiter outputs that addresses at least some of the problems and disadvantages associated with conventional systems and methods.

SUMMARY

The present invention provides for a method for characterization of pulse-width limiter outputs. A known clock signal is received. A pulse width of the received known clock signal is limited through a first pulse-width limiter to generate a first intermediate signal. The first intermediate signal is delayed by a known amount to generate a first delayed signal. The first intermediate signal is inverted to generate a first inverted signal. A pulse width of the first inverted signal is limited through a second pulse-width limiter to generate a second intermediate signal. The second intermediate signal is delayed by a known amount to generate a second delayed signal. A logic "OR" operation is performed on the first delayed signal and the second delayed signal to generate a clock out signal.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

The following discussion sets forth numerous specific details to provide a thorough understanding of the present invention. However, those skilled in the art will appreciate that the present invention may be practiced without such specific details. In other instances, the following discussion illustrates well-known elements in schematic or block diagram form in order not to obscure the present invention in unnecessary detail. Additionally, for the most part, the following discussion omits details concerning network communications, electro-magnetic signaling techniques, user interface or input/output techniques, and the like, inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or in some combinations thereof. In a preferred embodiment, however, a processor such as a computer or an electronic data processor performs the functions in accordance with code such as computer program code, software, and/or integrated circuits that are coded to perform such functions, unless indicated otherwise.

Figure 1:
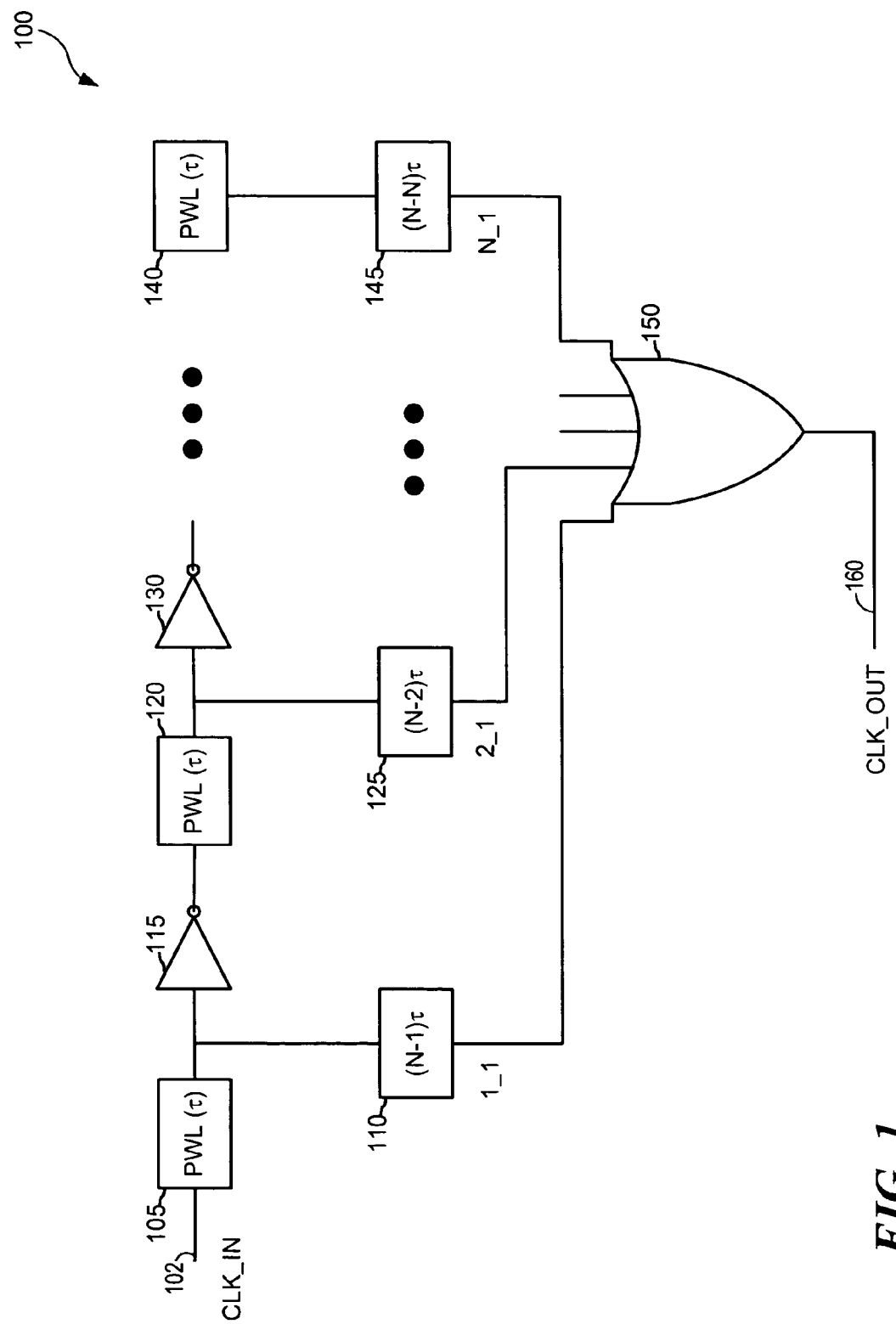
FIG. 1 is a block diagram depicting a pulse-width limiter output characterization system.

FIG. 1 depicts a pulse-width limiter output characterization system 100. Pulse-width limiter output characterization system 100 includes pulse-width limiter (PWL) 105. PWL 105 is a circuit or circuits or other suitable logic and is configured to perform pulse-width limiting operations. In one embodiment, PWL 105 is configured to receive an input signal and to limit a pulse width of the received input signal.

In the illustrated embodiment, PWL 105 is configured to receive a clock signal, $CLK_{13}$ IN 102, and to limit the pulse width of the received $CLK_{13}$ IN signal 102, to generate an intermediate signal. Generally, as one skilled in the art will understand, the pulse width of the output of PWL 105, the intermediate signal, is smaller than the pulse width of the received CLK_IN signal 102. Additionally, one object of PWL output characterization system 100 is to aid in identifying the characteristics of the output of PWL 105 as compared to the input signal.

In a particular embodiment, PWL 105 is configured to delay a rising edge of its input by a fixed amount of time and to combine the delayed rising edge with either a received falling edge or a fixed maximum pulse-width edge to generate an output pulse-width-limited signal. That is, where the input signal to PWL 105 has a pulse width that is smaller than the maximum pulse width, PWL 105 delays a rising edge of the output signal by a fixed amount of time from the input signal rising edge, and delays a falling edge of the output signal by a fixed amount of time from the input signal falling edge. Where the input signal to PWL 105 has a pulse width that is larger than the maximum pulse width, PWL 105 delays a rising edge of the output signal by a fixed amount of time from the input signal rising edge, and delays a falling edge of the output signal to the maximum pulse width from the delayed rising edge, as one skilled in the art will understand. In the illustrated embodiment, the variable name "tau"($\tau$) identifies the fixed amount of time by which the input signal rising edge is delayed.

PWL 105 is coupled to delay circuit 110. Delay circuit 110 is a circuit or circuits or other suitable logic and is configured to receive an input signal and to generate a delayed signal based on the input signal and a predetermined time delay. In a particular embodiment, delay circuit 110 is configured to generate a delayed signal with a rising edge that is delayed by a predetermined time delay from the input signal, the intermediate signal from PWL 105, rising edge, and a falling edge that is delayed by the same predetermined time delay from the input signal falling edge.

In the illustrated embodiment, the predetermined time delay is a function of $\tau$, the fixed amount of time by which the input signal, CLK_IN 102, rising edge is delayed by PWL 105. In particular, delay circuit 110 is configured with a predetermined time delay of $(N-1)\tau$, where "N" represents the total number of pulse-width limiters employed in PWL output characterization system 100. One skilled in the art will understand that other configurations can also be employed. As described in more detail below, the output of delay circuit 110 is an input to OR gate 150.

PWL 105 is also coupled to inverter 115. Inverter 115 is a circuit or circuits or other suitable logic and is configured to receive an input signal and to generate an inverted signal based on the received input signal. In particular, inverter 115 is configured to receive the intermediate signal from PWL 105 and to generate an output signal that is the logical inverse of the received intermediate signal. For ease of illustration, FIG. 1 shows the latency introduced by each stage ($\tau$) as solely due to the PWLs. In ordinary operations, however, one skilled in the art will understand that the latency of each stage includes the latency introduced by the PWL and also the associated inverter at the output of the PWL. For ease of illustration, however, the following discussion assumes that the latency of the inverters is bundled into $\tau$.

Inverter 115 is coupled to PWL 120. PWL 120 is a circuit or circuits or other suitable logic and is configured to perform pulse-width limiting operations. In particular, in the illustrated embodiment, PWL 120 is configured identically to PWL 105. Thus, as described in more detail below, the output of PWL 105 passes through inverter 115, whose output is then used as the input to PWL 120, and the system repeats this sequence N times in a chain where N PWL circuits are cascaded. Additionally, the output of PWL 120 is a second intermediate signal, which, like the intermediate signal that is the output of PWL 105, serves as the input for an inverter and a delay circuit.

In particular, PWL 120 is coupled to delay circuit 125. Delay circuit 125 is a circuit or circuits or other suitable logic and is configured to receive an input signal and to generate a delayed signal based on the input signal and a predetermined time delay. In a particular embodiment, delay circuit 125 is configured to generate a delayed signal with a rising edge that is delayed by a predetermined time delay from the input signal, the intermediate signal from PWL 105, rising edge, and a falling edge that is delayed by the same predetermined time delay from the input signal falling edge. In the illustrated embodiment, delay circuit 125 is configured with a predetermined time delay of $(N-2)\tau$. As with the output of delay circuit 110, the output of delay circuit 125 is an input to OR gate 150.

PWL 120 is also coupled to inverter 130. Inverter 130 is a circuit or circuits or other suitable logic and is configured to receive an input signal and to generate an inverted signal based on the received input signal. In particular, inverter 130 is configured to receive the intermediate signal from PWL 120 and to generate an output signal that is the logical inverse of the received intermediate signal. In the illustrated embodiment, the output of inverter 130 serves as the input to the next PWL in the sequence. Thus, one skilled in the art will understand that the sequence continues as described above, with the input to each subsequent PWL the output of the immediately upstream inverter, and the output of each subsequent PWL serving as the input to a downstream delay circuit.

Thus, the last inverter in the series is coupled to the Nth, and final, PWL of PWL output characterization system 100, PWL 140. PWL 140 is a circuit or circuits or other suitable logic and is configured to perform pulse-width limiting operations. In particular, in the illustrated embodiment, PWL 140 is configured identically to PWL 105 and PWL 120, and each PWL of PWL output characterization system 100.

PWL 140 is coupled to delay circuit 145. Delay circuit 145 is a circuit or circuits or other suitable logic and is configured to receive an input signal and to generate a delayed signal based on the input signal and a predetermined time delay. In a particular embodiment, delay circuit 145 is configured to generate a delayed signal with a rising edge that is delayed by a predetermined time delay from the input signal, the intermediate signal from PWL 140, rising edge, and a falling edge that is delayed by the same predetermined time delay from the input signal falling edge. In the illustrated embodiment, delay circuit 145 is configured with a predetermined time delay of $(N-N)\tau$, or zero delay. As with the outputs of delay circuit 110 and delay circuit 125, the output of delay circuit 145 is an input to OR gate 150.

Thus, generally, in the illustrated embodiment, an associated delay circuit delays the output of a particular PWL by a predetermined time delay of $(N-X)\tau$, where "N" represents the total number of PWLs in PWL output characterization system 100 and "X" represents the ordinal rank or position of the particular PWL. Therefore, one skilled in the art will understand that the delay circuit associated with the last, or Nth, PWL, delay circuit 145 in the illustrated embodiment, is configured to delay the output of its associated PWL, PWL 140, by the predetermined time delay of $(N-N)\tau$, or zero delay. Accordingly, one skilled in the art will understand that the last, or Nth, delay circuit can be omitted from PWL output characterization system 100.

As described above, PWL output characterization system 100 includes OR gate 150. OR gate 150 is a circuit or circuits or other suitable logic and is configured as a logic "OR" gate, as one skilled in the art will understand. OR gate 150 is coupled to each delay circuit, and receives as input the output of each delay circuit, which in the illustrated embodiment is a plurality of delayed signals. As used herein, "each" means all of a particular subset. The output of OR gate 150 in the illustrated embodiment is a signal designated, "CLK_OUT 160."

Thus, generally, PWL output characterization system 100 employs a cascade of pulse-width limiting circuits, combining the outputs of each to generate a system output pulse of arbitrary duration that can then be characterized in an ordinary lab environment. Thus, an associated delay circuit delays the output of each PWL by a specific time delay, which outputs OR gate 150 combines together through a logic "OR" operation to generate a system output pulse. Accordingly, where each PWL is configured to generate an intermediate signal with a maximum pulse width, or $T_{max}$, and PWL output characterization system 100 includes N PWL, the system output pulse will have a pulse width with a duration equal to $NT_{max}$. Therefore, PWL output characterization system 100 can be configured to reduce the bandwidth requirement of a characterization environment. Moreover, PWL output characterization system 100 can be configured such that the particular maximum pulse width of each pulse-width limiter is unknown, pending analysis of the system output pulse.

For further illustration of the interaction of the components of PWL output characterization system 100, FIG. 1 provides labels for the output signals of the delay circuits, the delayed signals as described above. In particular, FIG. 1 labels the output signal of delay circuit 110 "1_1", the output signal of delay circuit 125 "2_1", and the output signal of delay circuit 145 "N_1." The discussion accompanying FIG. 2 presents an illustrative waveform analysis.

Figure 2:
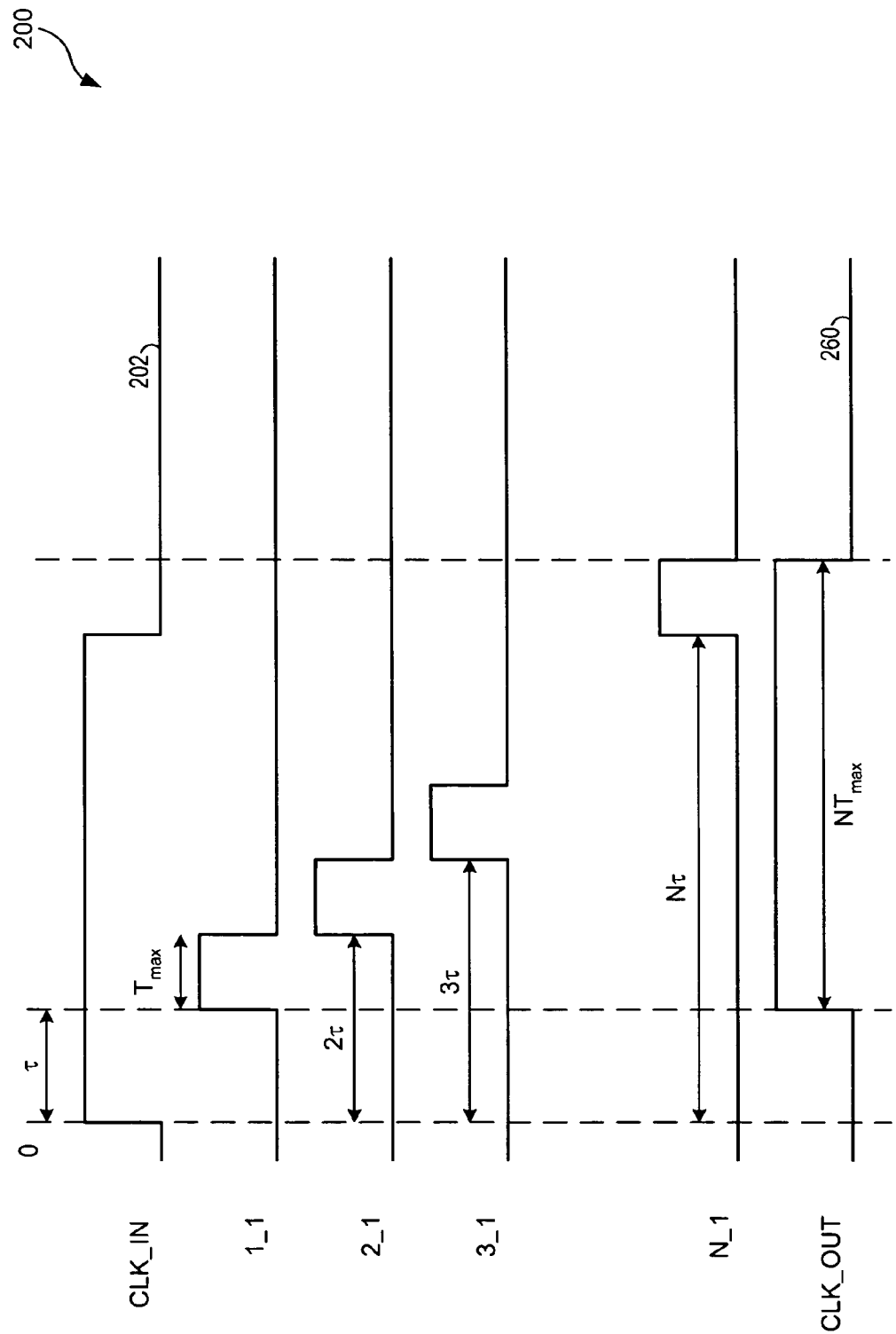
FIG. 2 illustrates an example waveform for a pulse-width limiter output characterization system.

FIG. 2 depicts a collection of waveforms 200. In the illustrated embodiment, CLK_IN 202 represents an input to PWL output characterization system 100. As depicted, at time 0, the CLK_IN signal 202 is asserted or at a logic high value. As described above, CLK_IN 202 is the input to PWL 105 of FIG. 1. Thus, at time $N\tau$, the output from delay circuit 110 of FIG. 1, 1_1, is at a logic high state. That is, PWL 105 introduces a delay of $\tau$ to generate an intermediate signal, a pulse-width-limited signal with a pulse width of $T_{max}$, which delay circuit 110 further delays by a predetermined delay time of $(N-1)\tau$, to generate a delayed signal with a combined delay from time 0 of $(N-1)\tau+\tau$, or $N\tau$.

Similarly, the output from delay circuit 125 of FIG. 1, 2_1, is at a logic high state at the falling edge of signal 1_1, at time $N\tau$ plus the maximum pulse width of PWL 105, $T_{max}$. As shown in the illustrated embodiment, the subsequent signals 3_1 though N_1 together form a cascade of pulses to the OR gate 150. Thus, the output of OR gate 150, CLK_OUT 260, is at a logic high state at time $\tau$ through time $\tau+NT_{max}$, and has a pulse width of $NT_{max}$. Therefore, one can determine the maximum pulse width for each PWL, $T_{max}$, through analysis of the CLK_OUT signal 260, by dividing the pulse width by N, the number of PWLs of PWL output characterization system 100.

Therefore, one can determine an accurate characterization of the outputs of a pulse-width limiter circuit in an ordinary laboratory setup. Furthermore, by stretching the pulse width of the CLK_OUT signal 260, PWL output characterization system 100 can relax jitter and/or frequency requirements for on-chip sampling and characterization of the PWL output. For example, if one samples a single PWL with VCO phases that have minimum increments of $\delta$, then one can describe the maximum on-chip characterization error, expressed as a fraction of the maximum allowable pulse width $T_{max}$, of the PWL, as: $|Error|=\delta/T_{max}$. However, where one cascades N PWLs, as in PWL output characterization system 100, one can describe the error as: $|Error|=\delta/(NT_{max})$. Accordingly, one skilled in the art will understand that one can employ PWL output characterization system 100 to improve on-chip PWL characterization accuracy by a factor of N.

Figure 3:
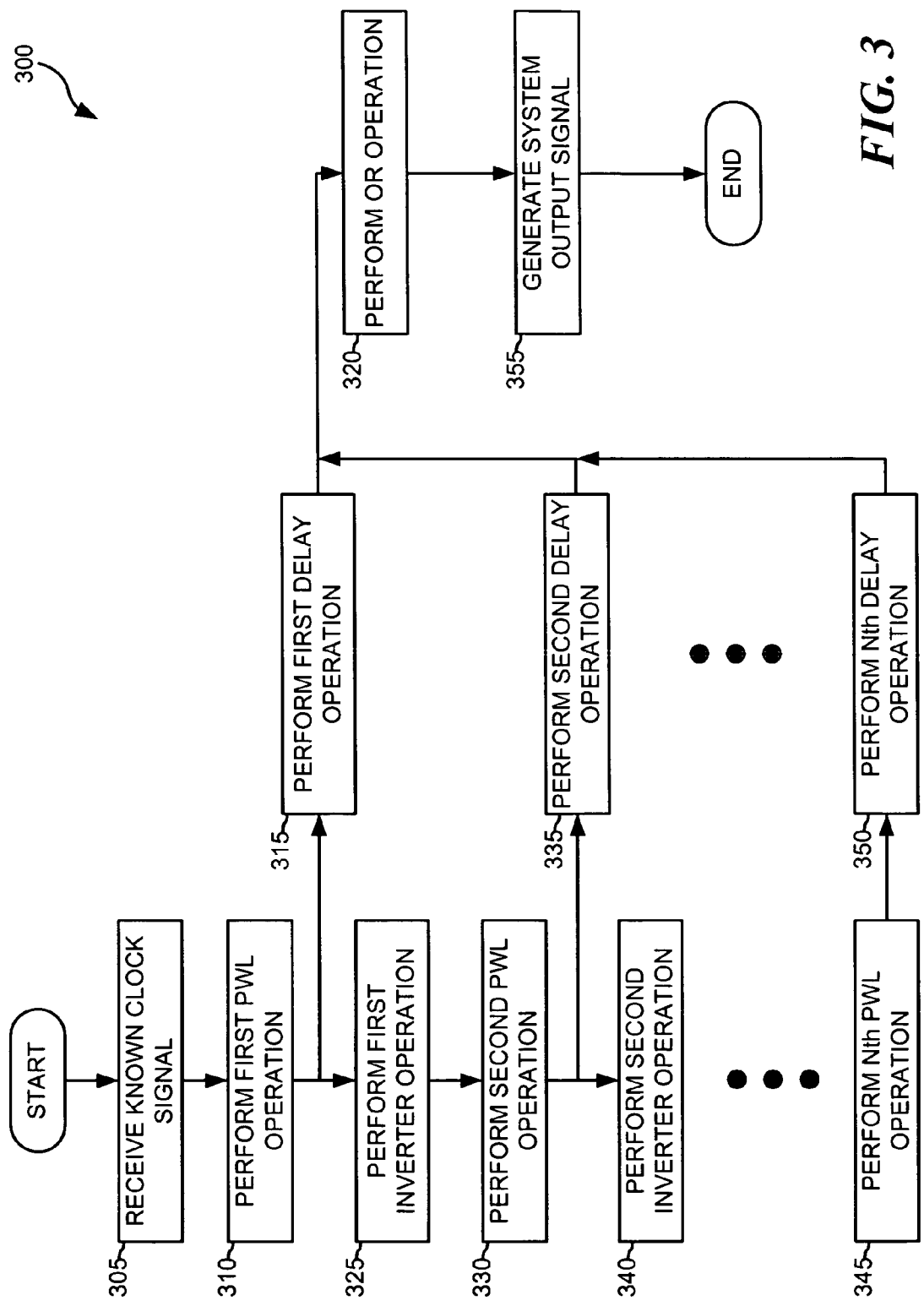
FIG. 3 is a flow diagram depicting a pulse-width limiter output characterization method.

FIG. 3 depicts a flow diagram 300 illustrating a method for on/off-chip characterization of pulse-width limiter outputs. The process begins at step 305, wherein the system receives a known clock signal. PWL 105 of FIG. 1, for example, can perform this step. At next step 310, a first pulse-width limiter performs a first pulse-width-limiting operation. PWL 105 of FIG. 1, for example, can perform this step.

At next step 315, a first delay circuit performs a first delay operation on the resultant signal of the first pulse-width-limiting operation of step 310. Delay circuit 110 of FIG. 1, for example, can perform this step. In one embodiment, as described above, the first delay operation is based on a multiple of a delay associated with the first pulse-width-limiting operation of step 310. At next step 320, an OR gate 150 performs a logic OR operation on the result of the first delay operation of step 315, and, as described in more detail below, the results of the delay operations performed in step 335 and 350. OR gate 150 of FIG. 1, for example, can perform this step. One skilled in the art will understand that one can perform step 320 contemporaneously with other steps and/or otherwise on a continuous basis.

At next step 325, a first inverter performs a first inverter operation on the resultant signal of the first pulse-width-limiting operation of step 310. Inverter 115 of FIG. 1, for example, can perform this step. At next step 330, a second pulse-width limiter performs a second pulse-width-limiting operation on the resultant signal of the first inverter operation of step 325. PWL 120 of FIG. 1, for example, can perform this step. At next step 335, a second delay circuit performs a second delay operation on the resultant signal of the second pulse-width-limiting operation of step 330. Delay circuit 125 of FIG. 1, for example, can perform this step.

At next step 340, a second inverter performs a second inverter operation on the resultant signal of the second pulse-width-limiting operation of step 330. The results of this second pulse-width-limiting operation then serve as input to a subsequent stage including a delay operation, which results then serve as an input to the OR operation of step 320, and an inverter operation, which results then serve as an input to a subsequent pulse-width-limiting operation, and so forth. The process continues as such through the Nth stage, where N is the number of pulse-width-limiting operations performed in the process.

At next step 345, an Nth pulse-width limiter performs an Nth pulse-width-limiting operation on the resultant signal of the immediately previous inverter operation. PWL 140 of FIG. 1, for example, can perform this step. At next step 350, an Nth delay circuit performs an Nth delay operation on the resultant signal of the pulse-width-limiting operation of step 345. Delay circuit 145 of FIG. 1, for example, can perform this step.

As described above, at step 320, an OR gate 150 performs a logic "OR" operation on the resultant signals of the collective delay operations, that is, the delay operations of step 315, step 335, step 350, and any intermediate stages between step

340 and step 350. At next step 355, the "OR" gate generates a system output signal based on the logic "OR" operation of step 320, and the process ends. OR gate 150 of FIG. 1, for example, can perform this step.

The particular embodiments disclosed above are illustrative only, as one may modify the invention and practice the invention in different but equivalent manners apparent to those skilled in the art having the benefit of the teachings herein. Furthermore, the foregoing discussion intends no limitations to the details of construction or design herein shown, other than as described in the claims below. It is therefore evident that one may alter or modify the particular embodiments disclosed above and that all such variations are within the scope and spirit of the invention. Accordingly, the claims below set forth the protection sought herein.

What is claimed is:

1. A method for characterization of pulse-width limiter outputs, comprising:
   receiving a known clock signal;
   limiting a pulse width of the received known clock signal through a first pulse-width limiter to generate a first intermediate signal;
   delaying the first intermediate signal by a known amount to generate a first delayed signal;
   inverting the first intermediate signal to generate a first inverted signal;
   limiting a pulse width of the first inverted signal through a second pulse-width limiter to generate a second intermediate signal;
   delaying the second intermediate signal by a known amount to generate a second delayed signal; and
   performing a logic OR operation on the first delayed signal and the second delayed signal to generate a clock out signal.

2. The method as recited in claim 1, wherein the first pulse-width limiter and the second pulse-width limiter are configured as identical circuits.

3. The method as recited in claim 1, wherein the first intermediate signal is delayed based on a multiple of a delay amount of the first pulse-width limiter.

4. The method as recited in claim 1, further comprising:
   inverting the second intermediate signal to generate a second inverted signal;
   limiting a pulse width of the second inverted signal through a third pulse-width limiter to generate a third intermediate signal;
   delaying the third intermediate signal by a known amount to generate a third delayed signal; and
   performing a logic OR operation on the first delayed signal, the second delayed signal, and the third delayed signal, to generate a clock out signal.

5. The method as recited in claim 4, further comprising:
   inverting the third intermediate signal to generate a third inverted signal;
   limiting a pulse width of the third inverted signal through a fourth pulse-width limiter to generate a fourth intermediate signal;
   delaying the fourth intermediate signal by a known amount to generate a fourth delayed signal; and
   performing a logic OR operation on the first delayed signal, the second delayed signal, the third delayed signal, and the fourth delayed signal to generate a clock out signal.

6. The method as recited in claim 5, wherein:
   each of the first pulse-width limiter, the second pulse-width limiter, the third pulse-width limiter, and the forth pulse-width limiter are configured to limit a pulse width of an input signal by a same fixed width amount;
   the first intermediate signal is delayed by three times the fixed width amount;
   the second intermediate signal is delayed by two times the fixed width amount; and
   the third intermediate signal is delayed by the fixed width amount.

7. A system, comprising:
   a first pulse-width limiter configured to receive a known clock signal and to limit a pulse width of received known clock signals to generate a first intermediate signal;
   a first delay circuit coupled to the first pulse-width limiter and configured to receive the first intermediate signal and to delay the first intermediate signal to generate a first delayed signal;
   a first inverter coupled to the first pulse-width limiter and configured to receive the first intermediate signal and to invert the first intermediate signal to generate a first inverted signal;
   a second pulse-width limiter coupled to the first inverter and configured to receive the first inverted signal and to limit a pulse width of the first inverted signal to generate a second intermediate signal;
   a second delay circuit coupled to the second pulse-width limiter and configured to receive the second intermediate signal and to delay the second intermediate signal to generate a second delayed signal; and
   an OR gate coupled to the first delay circuit and the second delay circuit and configured to receive the first delayed signal and the second delayed signal, and to perform a logic OR operation on the received first delayed signal and second delayed signal to generate a clock out signal.

8. The system as recited in claim 7, wherein the first pulse-width limiter and the second pulse-width limiter are configured as identical circuits.

9. The system as recited in claim 7, wherein the first intermediate signal is delayed based on a multiple of a delay amount of the first pulse-width limiter.

10. The system as recited in claim 7, further comprising:
    a second inverter coupled to the second pulse-width limiter and configured to receive the second intermediate signal and to invert the second intermediate signal to generate a second inverted signal;
    a third pulse-width limiter coupled to the second inverter and configured to receive the second inverted signal and to limit a pulse width of the second inverted signal to generate a third intermediate signal;
    a third delay circuit coupled to the third pulse-width limiter and configured to receive the third intermediate signal and to delay the third intermediate signal to generate a third delayed signal; and
    the OR gate further coupled to the third delay circuit and further configured to receive the third delayed signal, and to perform a logic OR operation on the received first delayed signal, second delayed signal, and third delayed signal to generate a clock out signal.

11. The system as recited in claim 10, further comprising:
    a third inverter coupled to the third pulse-width limiter and configured to receive the third intermediate signal and to invert the third intermediate signal to generate a third inverted signal;
    a fourth pulse-width limiter coupled to the third inverter and configured to receive the third inverted signal and to limit a pulse width of the third inverted signal to generate a fourth intermediate signal;
    a fourth delay circuit coupled to the fourth pulse-width limiter and configured to receive the fourth intermediate signal and to delay the fourth intermediate signal to generate a fourth delayed signal; and the OR gate further coupled to the fourth delay circuit and further configured to receive the fourth delayed signal, and to perform a logic OR operation on the received first delayed signal, second delayed signal, third delayed signal, and fourth delayed signal to generate a clock out signal.

12. The system as recited in claim 11, wherein:

each of the first pulse-width limiter, the second pulse-width limiter, the third pulse-width limiter, and the forth pulse-width limiter are configured to limit a pulse width of an input signal by a same fixed width amount;

the first intermediate signal is delayed by three times the fixed width amount;

the second intermediate signal is delayed by two times the fixed width amount; and the third intermediate signal is delayed by the fixed width amount.

13. A processor for characterization of pulse-width limiter outputs, the processor including a computer program comprising:

computer program code for receiving a known clock signal;

computer program code for limiting a pulse width of the received known clock signal through a first pulse-width limiter to generate a first intermediate signal;

computer program code for delaying the first intermediate signal by a known amount to generate a first delayed signal;

computer program code for inverting the first intermediate signal to generate a first inverted signal;

computer program code for limiting a pulse width of the first inverted signal through a second pulse-width limiter to generate a second intermediate signal;

computer program code for delaying the second intermediate signal by a known amount to generate a second delayed signal; and computer program code for performing a logic OR operation on the first delayed signal and the second delayed signal to generate a clock out signal.

14. The processor as recited in claim 13, wherein the computer program code for the first pulse-width limiter and the computer program code for second pulse-width limiter are configured as identical.

15. The processor as recited in claim 13, wherein the first intermediate signal is delayed based on a multiple of a delay amount of the first pulse-width limiter.

16. The processor as recited in claim 13, further comprising:

computer program code for inverting the second intermediate signal to generate a second inverted signal;

computer program code for limiting a pulse width of the second inverted signal through a third pulse-width limiter to generate a third intermediate signal;

computer program code for delaying the third intermediate signal by a known amount to generate a third delayed signal; and computer program code for performing a logic OR operation on the first delayed signal, the second delayed signal, and the third delayed signal, to generate a clock out signal.

17. The processor as recited in claim 16, further comprising:

computer program code for inverting the third intermediate signal to generate a third inverted signal;

computer program code for limiting a pulse width of the third inverted signal through a fourth pulse-width limiter to generate a fourth intermediate signal;

computer program code for delaying the fourth intermediate signal by a known amount to generate a fourth delayed signal; and computer program code for performing a logic OR operation on the first delayed signal, the second delayed signal, the third delayed signal, and the fourth delayed signal to generate a clock out signal.

18. The processor as recited in claim 17, wherein:

each of the first pulse-width limiter, the second pulse-width limiter, the third pulse-width limiter, and the forth pulse-width limiter are configured to limit a pulse width of an input signal by a same fixed width amount;

the first intermediate signal is delayed by three times the fixed width amount;

the second intermediate signal is delayed by two times the fixed width amount; and the third intermediate signal is delayed by the fixed width amount.

* * * * *